United States Patent [19]
Batruni

[11] Patent Number: 5,297,166
[45] Date of Patent: Mar. 22, 1994

[54] METHOD AND APPARATUS FOR DECISION FEEDBACK EQUALIZATION WITH REDUCED CONVERGENCE TIME

[75] Inventor: Roy G. Batruni, Fremont, Calif.

[73] Assignee: National Semiconductor Corporation, Santa Clara, Calif.

[21] Appl. No.: 907,377

[22] Filed: Jul. 2, 1992

[51] Int. Cl.$^5$ ............................................. H03K 5/159
[52] U.S. Cl. ...................................... 375/14; 375/103; 364/724.2
[58] Field of Search .................... 375/12, 13, 14, 103; 333/18, 28 R; 364/724.19, 724.20

[56] References Cited

U.S. PATENT DOCUMENTS

| | | | |
|---|---|---|---|
| 4,564,952 | 1/1986 | Karabinis et al. | 375/101 |
| 4,669,092 | 5/1987 | Sari et al. | 375/14 |
| 4,870,657 | 9/1989 | Bergman et al. | 375/14 |
| 5,157,690 | 10/1992 | Buttle | 375/14 |
| 5,164,962 | 11/1992 | Nakai et al. | 375/13 |

*Primary Examiner*—Stephen Chin
*Attorney, Agent, or Firm*—Limbach & Limbach

[57] ABSTRACT

A method and apparatus for performing blind mode decision feedback equalization with reduced convergence time. In operation, the decision feedback equalizer (DFE) of the invention receives a transmitted signal x(n) resulting from transmission of an input signal s(n) through a transmission channel and a receive filter. The apparatus includes a DFE feedback loop having an adaptive filter designed to converge rapidly and iteratively during blind mode decision feedback equalization to a best approximation $A'(z)$ of the unknown, combined, transmission channel and receive filter transfer function $A(z)$. In a preferred embodiment, the apparatus includes DFE circuitry for implementing a Widrow-Hoff least-mean-squared adaptation process, including circuitry for generating an input signal replica s'(n) and an error signal e(n) during each iteration of the adaptation process. In this embodiment, the adaptive filter adaptively generates N replica coefficients $a'_j(n)$, where $j = 1, 2, \ldots, N$, which define approximation $A'(z)$, and a replica coefficient $a'_0(n)$ which is employed to update the error signal e(n).

10 Claims, 3 Drawing Sheets

METHOD AND APPARATUS FOR DECISION FEEDBACK EQUALIZATION WITH REDUCED CONVERGENCE TIME

FIELD OF THE INVENTION

The invention relates to electronic circuitry for performing decision feedback equalization, and to decision feedback equalization methods. More particularly, the invention relates to a method and apparatus for reducing convergence time during performance of blind mode decision feedback equalization.

BACKGROUND OF THE INVENTION

Throughout this specification including in the claims, the terms "symbol" and "data symbol" are used to denote any characteristic of a signal. Examples of data symbols include amplitude of a digital voltage signal (whose amplitude can have any of a set of discrete values), phase of an electrical current signal, or an amplitude of a Fourier component of an electrical voltage pulse.

An inherent problem with transmission of data over a communication channel is that distortion and additive noise tend to interfere with proper reception of the transmitted data. Distortion during transmission of data pulses alters the received data symbols (e.g., the received pulse shape of each data pulse). This causes each symbol to interfere with several adjacent symbols, which inhibits the receiver from performing symbol detection and timing recovery. Additive noise further degrades the ability of the receiver to distinguish between received symbol levels.

Conventional receiver filtering techniques can counter distortion and additive noise effects to provide good symbol decision capability. For example, one type of conventional receiver (shown in FIG. 1) includes a linear feedforward filter followed by a nonlinear decision feedback equalizer (DFE). Conventional DFE circuits are nonlinear, due to quantizer circuitry therein which performs symbol decisions in the DFE feedback loop.

In the conventional circuit of FIG. 1, input signal s(n) has a z-domain representation s(z) as indicated in FIG. 1 (the parameter "n" can represent time, and "z" can represent frequency). In the context of each iteration of a decision feedback equalization cycle (and the processing performed during each such iteration), the parameter "n" indicates the number of each iteration so that, for example, s'(n−1) and s'(n) represent consecutive values or samples of a signal during two consecutive iterations of a DFE cycle).

Input signal coefficients s(z) propagate through the transmission channel identified as filter 2, which has z-domain transfer function H(z). Filter 2 typically has unknown characteristics. After propagating through the transmission channel (i.e., after being filtered by filter 2), the input signal is filtered by receive filter 4, which has z-domain transfer function R(z). As indicated in FIG. 1, the combined transfer function of filter 2 and receive filter 4 is A(z), and coefficients "t(z)" are the z-domain response of the combination of filters 2 and 4 to input coefficients s(z).

Receive filter 4 (sometimes referred to herein as a "feedforward" filter) is typically designed to perform pulse shaping functions such as decreasing the rise time of each input pulse which it receives (for timing recovery purposes), or suppressing the tail of each input pulse which it receives to enable minimization of the number (N) of coefficients of a DFE feedback loop filter 12.

Additive noise (identified as "u(z)" in FIG. 1) typically becomes associated with the input signal during propagation through the transmission channel. To reflect this phenomenon, FIG. 1 indicates the presence of noise u(z) at the input of receive filter 4, and identifies the response of filter 4 to additive noise u(z) as filtered noise "w(z)." The combined response of filter 4 to noise u(z) and to filter 2's response to signal s(z) is identified as "x(z)" in FIG. 1. Combined response x(z) undergoes further processing (decision feedback equalization) in DFE components 8, 10, 12, and 14 of the FIG. 1 apparatus. Although FIG. 1 represents generation of combined response x(z) by summation of filtered noise w(z) with response t(z), it should be appreciated that an actual physical implementation of the FIG. 1 apparatus would include a single filter 4 whose single output x(z) has components w(z) and t(z), and that an actual physical implementation of the FIG. 1 apparatus would not include an actual summation circuit for summing together two distinct signals (corresponding to w(z) and t(z)) to generate response x(z).

As indicated in FIG. 1, the decision feedback equalization of response x(z) includes the steps of processing response x(z) in subtraction circuit 8, followed by processing of the output of circuit 8 in quantization circuit 10 and subtraction circuit 14, and generation of a feedback coefficients x'(z) in adaptive finite impulse response filter 12 for subtraction from response coefficients x(z) in subtraction circuit 8.

To make the following description more definite, input signal s(n) is assumed to be a pulse whose amplitude can have only certain discrete values, i.e., the amplitude of s(n) is a member of a set of L discrete values $Q = \{q_1, q_2, \ldots, q_L\}$ for each value of "n." In response to such an input signal, the output signal x(n), having z-domain coefficients x(z), has the following form:

$$x(n) = \sum_{j=0}^{M+P-1} a_j s(n-j) + \sum_{k=0}^{P-1} u(n-k) r_k$$

where the first summation represents signal t(n) (whose z-domain representation is t(z)), the second summation represents noise w(n) (whose z-domain representation is w(z)), M is the number of z-domain coefficients of transfer function H(z) of filter 2, and P is the number of z-domain coefficients of transfer function R(z) of receive filter 4. The first coefficient $a_0 s(n)$ of the first summation is indicative of input signal s(n). The other coefficients of the first summation represent intersymbol interference. Coefficients $r_k$ of receive filter 4 can be determined adaptively, or by some fixed criteria that determine one or more pulse shape characteristics.

The function of DFE loop components 8, 10, 12, and 14 of FIG. 1 is to cancel the inter-symbol interference and perform symbol detection (to generate a replica s'(n) of input signal s(n)). Practical embodiments of this DFE circuitry will equalize the lowest N z-domain coefficients of signal x(n), where N < M+P, while approximating the first N of above-mentioned coefficients $a_j$. In such embodiments, the DFE circuitry can equalize part but not all of the response t(z) to combined filters 2 and 4. After the DFE circuitry has converged to a final version of replica signal s'(n), such final version of signal s'(n) will satisfy the following relationship: s'(n) - $a_0 s(n)$ = e(n) = w(n). In other words, the final version of signal s'(n) will differ from a scaled version of input signal s(n) by error signal e(n), where e(n) has z-domain coefficients e(z) which satisfy e(z)=w(z), where w(z) are the z-domain coefficients of filter 4's response to additive noise u(n). Before the DFE circuitry reaches convergence, quantizer 10 outputs (during each feedback iteration) replica signal s'(z), in response to which circuit 14 generates error signal e(n) which satisfies e(n)=v(n)+w(n), where v(n) represents residual inter-symbol interference and w(n) is a filtered additive error signal having z-domain coefficients w(z).

We next describe the operation of conventional DFE circuitry 8, 10, 12, and 14 in greater detail, with reference to FIG. 1.

In subtraction circuit 8, feedback coefficients x'(z) (replicas of coefficients x(z) generated by adaptive finite impulse response filter 12 in a manner to be described below) are subtracted from signal x(z) to generate difference coefficients y(z)=x(z)−x'(z). Quantization circuit 10 processes difference coefficients y(z) to generate replica coefficients s'(z) which define a replica signal s'(n) whose value is the member of the set $\{q_k; k=1, 2, \ldots, L\}$ which best approximates input signal s(n).

Replica coefficients s'(z) are subtracted from coefficients y(z) in subtraction circuit 14 (after coefficients s'(z) are multiplied by scaling coefficient $a_0$, for example by means within circuit 14 or by circuit 16 shown in FIG. 2) to generate above-mentioned error coefficients e(z). Replica coefficients s'(z) and error coefficients e(z) are fed back to adaptive filter 12. In response, filter 12 applies adaptively generated transfer function A'(z) to coefficients x(z), to generate a set of replica coefficients x'(z) during each iteration of the DFE operation.

In a self training ("blind") mode in which the transmission channel transfer function H(z) is unknown, a conventional embodiment of adaptive finite impulse response filter 12 implements a well-known Widrow-Hoff least-mean-squared adaptation algorithm to converge iteratively on a best approximation of replica coefficients x'(z) and replica signal s'(n).

To simplify the following description of the conventional Widrow-Hoff least-mean-squared adaptation algorithm, we assume that receive filter 4 has the transfer function R(z)=1−(1/z). Thus, during blind mode operation, the channel response A(z) to which adaptive filter 12 must converge is A(z)=[1−(1/z)]H(z). Thus, the input signal x(n) received at subtraction circuit 8 is $$x(n) = \sum_{j=0}^{N} s(n-j)a_j + w(n),$$

where w(n) is additive noise, and the coefficients $a_j$ in the summation represent the values of the sampled pulse response $A(z)z^{-j}$ at z=0.

At the same time, adaptive filter 12 asserts an output signal x'(n) of form:

$$x'(n) = \sum_{j=1}^{N} s'(n-j)a'_j$$

where coefficients $a'_j$ are the value of the decision feedback equalizer coefficients, and s'(n−j) are the detected symbols. Signal x'(n), which has z-domain coefficients x'(z), is sometimes referred to as an inter-symbol interference replica (or "isi" replica).

After subtraction circuit 8 subtracts coefficients x'(z) from coefficients x(z) (i.e., after it subtracts signal x'(n) from signal x(n)) to generate difference coefficients y(z)=x(z)−x'(z), quantization circuit 10 processes coefficients y(z) to generate replica coefficients s'(z) which define replica signal s'(n).

Replica signal s'(n) output from quantizer 10 is the member of a set $Q+\{q_1, q_2, \ldots, q_L\}$ which produces the minimum value $e^2(n)$ of quantity $[y(n)-a'_0(n)q_k]^2$ for all values of k in the range from 1 through L.

Adaptive filter 12 implements a Widrow-Hoff least-mean-squared adaptation algorithm to generate replica coefficients x'(z) which define replica signal x'(n).

With reference to the FIG. 2 apparatus, we next explain the manner in which adaptive filter 12 implements such Widrow-Hoff least-mean-squared adaptation algorithm to generate replica coefficients x'(z). FIG. 2 shows details (not shown in FIG. 1) of a conventional implementation of a portion of the FIG. 1 apparatus.

Circuit 16 of FIG. 2 scales signal s'(n) by multiplying it by replica signal $a'_0(n-1)$. Signal $a'_0(n-1)$ can be updated by circuit 16 during each DFE feedback iteration by adding the signal Ke(n)s'(n) (which has been generated by circuitry discussed below) to the replica signal $a'_0(n-1)$ generated during the previous iteration, and then filtering the resulting sum in filter 17 (which has transfer function 1/z). Circuit 14 subtracts signal y(n) from the scaled signal $a'_0(n-1)s'(n)$ asserted at the output of circuit 16, thereby producing error signal e(n).

In FIG. 2, the following circuitry collectively corresponds to adaptive filter 12 of FIG. 1: a set of N identical phase delay filters (including filters 20, 22, 24, and 26), each having transfer function 1/z in a preferred embodiment in which receive filter 4 (shown in FIG. 1) has transfer function R(z)=1−1/z; a set of N adaptive coefficient filter circuits (including circuits 30, 32, 34, and 36); and addition circuit 40. In order to achieve convergence during conventional implementation of a Widrow-Hoff least-mean-squared adaptation algorithm, circuitry (not shown in FIG. 1 or FIG. 2) within the FIG. 2 apparatus processes the error signal e(n) output from circuit 14 during each DFE feedback iteration, and the replica signal s'(n) output from quantizer 10 during each DFE feedback iteration, to generate the following N+1 signals: Ke(n)s'(n), Ke(n)s'(n−1), Ke(n)s'(n−2), ..., and Ke(n)s'(n−N). In these signals, the convergence scaling factor K is determined in a conventional manner in accordance with the additive noise power expected to be present after convergence, the parameter L (indicative of the number of possible values of the input signal s(n)), the desired speed of convergence, and the required accuracy of replica signal s'(n) upon final convergence.

As represented in FIG. 2, the apparatus provides each of signals Ke(n)s'(n−1), Ke(n)s'(n−2), ..., and Ke(n)s'(n−N) to a corresponding one of the N adaptive coefficient filter circuits (including circuits 30, 32, 34, and 36). For example, signal Ke(n)s'(n−1) is provided to adaptive coefficient filter circuit 30, and signal Ke(n)s'(n−N) is provided to adaptive coefficient filter circuit 36.

Each of the N adaptive coefficient filter circuits (including circuits 30, 32, 34, and 36) also receives a phase delayed version of replica signal s'(n). For example, circuit 30 receives phase delayed signal s'(n−1) which has been phase delayed in filter 20, circuit 32 receives phase delayed signal s'(n−2) which has been phase delayed in filter 20 and then in filter 22, and circuit 36 receives phase delayed signal s'(n−N) which has been phase delayed sequentially in all of phase delay filters 20, 22, 24, and 26 (and the N−4 filters connected serially between filters 24 and 26).

During each iteration of a DFE feedback process prior to convergence, each of the N adaptive coefficient filter circuits (including circuits 30, 32, and 36) multiplies the phase delayed version of signal s'(n) it receives by a different adaptively generated coefficient a'$_j$(n−1). Specifically, the "jth" one of the adaptive coefficient filter circuits performs multiplication of the phase delayed signal s'(n−j) it receives by an adaptively generated coefficient a'$_j$(n−1). For example, circuit 30 multiplies phase delayed signal s'(n−1) by adaptively generated coefficient a'$_1$(n−1). Circuit 40 then adds together the outputs of the N adaptive coefficient filter circuits, thereby generating replica signal x'(n).

Thus, during the "nth" iteration of a DFE feedback process (prior to convergence), the FIG. 2 apparatus updates the vector A'(n−1) of DFE coefficients a'$_j$(n−1) generated during the previous ("(n−1)th") iteration, as follows:

$$A'(n)=A'(n-1)+KS'(n-1)e(n-1),$$

where A'(n) represents transposed vector [a$_1$(n) a$_2$(n) ... a$_N$(n)]$^T$, and S'(n−1) represents transposed vector [s'(n−1) s'(n−2) ... s'(n−N)]$^T$, and K is the abovementioned convergence scaling factor K.

The inventor has recognized that the conventional Widrow-Hoff least-mean-squared adaptation method described above with reference to FIG. 2 is undesirably slow in many applications, in that it typically requires an undesirably large number of DFE iterations until convergence is reached.

The present invention is an improved method and apparatus for achieving more rapid convergence during operation of a decision feedback equalizer. The present invention permits a decision feedback equalizer to reach convergence (in a blind mode) significantly more rapidly that can the FIG. 2 apparatus, during implementation of a Widrow-Hoff least-mean-squared adaptation method.

SUMMARY OF THE INVENTION

The invention is a method and apparatus for performing blind mode decision feedback equalization with reduced convergence time. In operation, the decision feedback equalizer of the invention receives a transmitted signal x(n) resulting from transmission of an input signal s(n) through a transmission channel and a receive filter. The inventive apparatus includes a DFE feedback loop having an adaptive filter designed to rapidly and iteratively converge (during blind mode decision feedback equalization) to a best approximation A'(z) of the unknown, combined, transmission channel and receive filter z-domain transfer function A(z).

In a preferred embodiment, the apparatus includes DFE circuitry for implementing a Widrow-Hoff least-mean-squared adaptation process, said DFE circuitry including means for generating an input signal replica s'(n) and an error signal e(n) during each iteration of the adaptation process. In this embodiment, the adaptive filter adaptively generates N replica coefficients a'$_j$(n) which define approximation A'(z), and replica coefficient a'$_0$(n) which is employed to generate error signal e(n). During the "nth" iteration of the process, the adaptive filter updates each replica coefficient a'$_j$ in response to a feedback signal Ke(n)s'(n−j), for j=0, and updates each other replica coefficient a'$_j$(n), for j=1, 2, 3, ..., N, in response to a feedback signal 2Ke(n)s'(n−j). Thus, during the "nth" iteration (prior to convergence), the apparatus updates the vector A'(n−1) of replica coefficients a'$_j$(n−1) generated during the previous ("(n−1)th") iteration, according to:

$$A'(n)=A'(n-1)+KWS'(n-1)e(n-1),$$

where A'(n) represents transposed vector [a'$_0$(n), a'$_1$(n) a'$_2$(n) ... a'$_N$(n)]$^T$, S'(n−1) represents transposed vector [s'(n) s'(n−1) s'(n−2) ... s'(n−N)]$^T$, K is a convergence scaling factor, and W is a diagonal (N+1)×(N+1) matrix having first diagonal coefficient equal to one, all other diagonal coefficients equal to two, and all off-diagonal coefficients equal to zero.

By updating the coefficients a'$_j$(n−1) in this manner, the invention achieves more rapid convergence than can be attained using prior art DFE apparatus for implementing Widrow-Hoff least-mean-squared adaptation processes.

In a class of embodiments in which the receive filter has transfer function R(z)=1−(1/z), so that the channel response A(z) to which the adaptive filter of the invention must converge is A(z)=[1−(1/z)]H(z), the adaptive filter includes a set of N serially connected phase delay circuits (each having transfer function 1/z), and a "coefficient updating and multiplication" circuit connected to the output of each phase delay circuit. During the "nth" iteration, the "jth" one of the "coefficient updating and multiplication" circuits updates coefficient a'$_j$(n−1) and multiplies phase delayed replica signal s'(n−j) by the resulting updated coefficient a'$_j$(n), where j=1, 2, ..., N. The outputs of the N coefficient updating and multiplication circuits are summed together to generate replica signal x'(n).

DETAILED DESCRIPTION OF THE PREFERRED EMBODIMENTS

A first preferred embodiment of the invention will be described with reference to FIG. 3. The FIG. 3 embodiment is designed for processing the same type of input signal as is the above-described FIG. 2 apparatus. All components of the FIG. 3 apparatus are identical (and function identically) to those of FIG. 2, except as described below.

Figure 1:
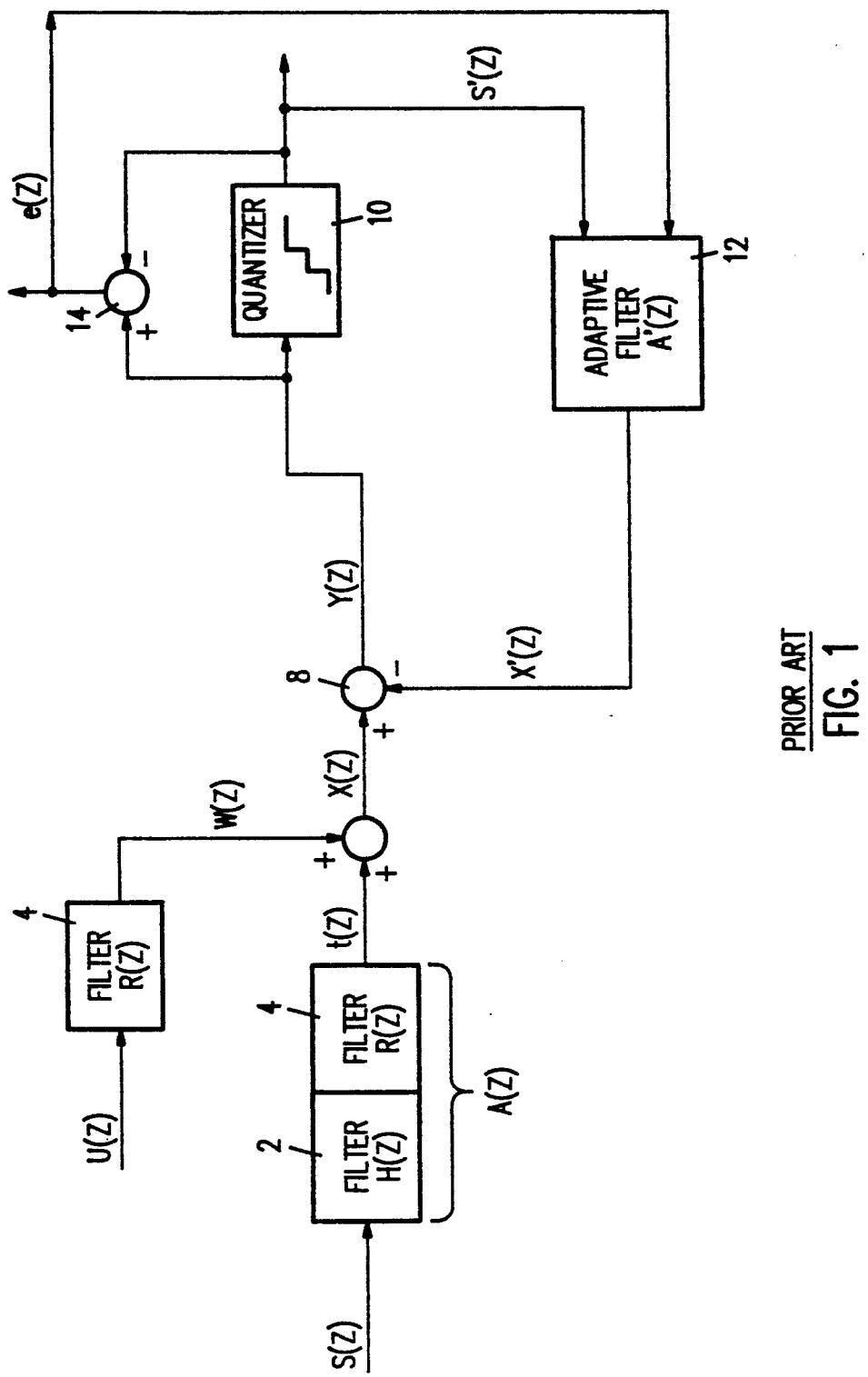
FIG. 1 is a block diagram of a conventional decision feedback equalizer circuit.
Figure 2:
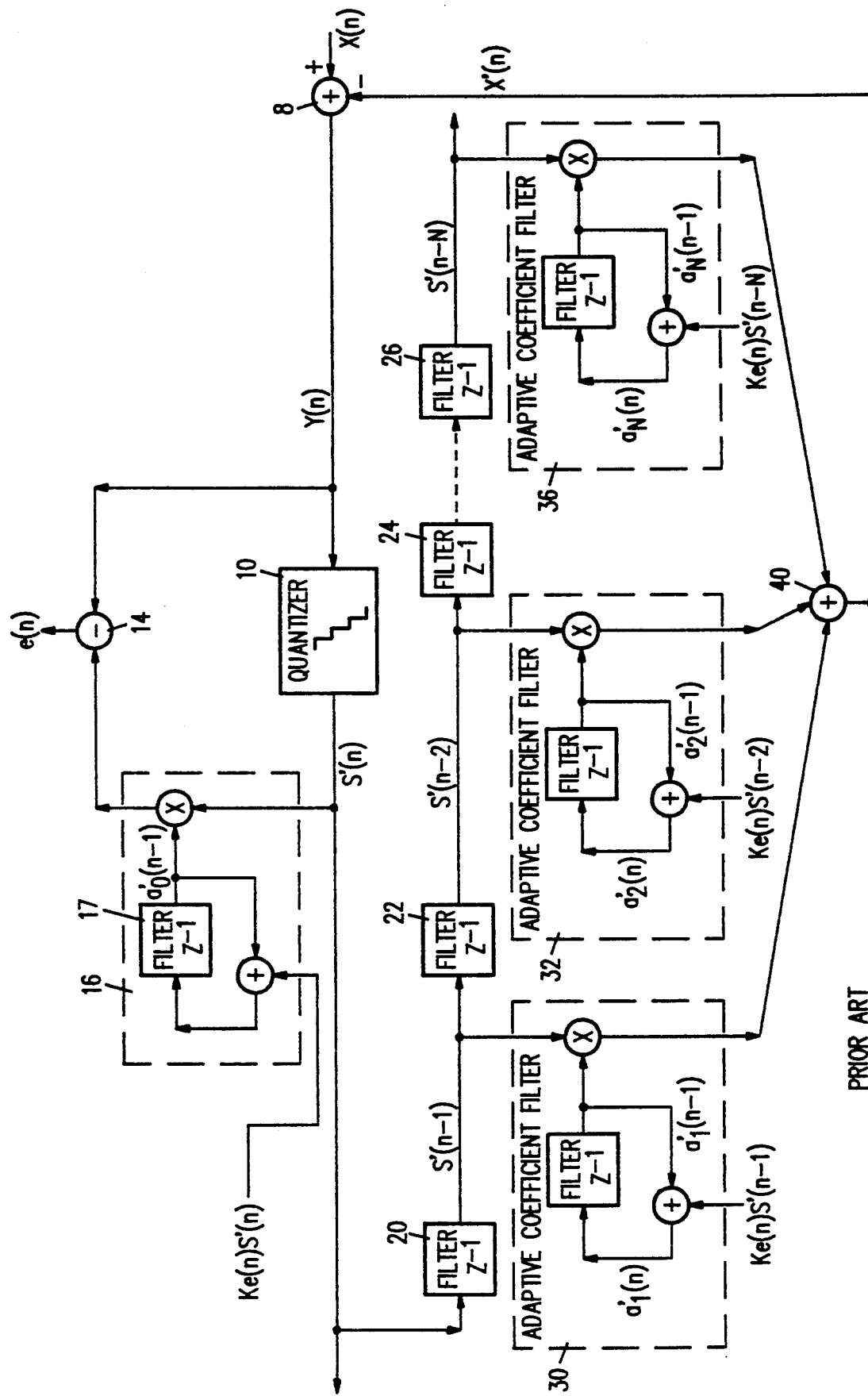
FIG. 2 is a block diagram of a detailed implementation of a portion of the conventional circuit of FIG. 1.
Figure 3:
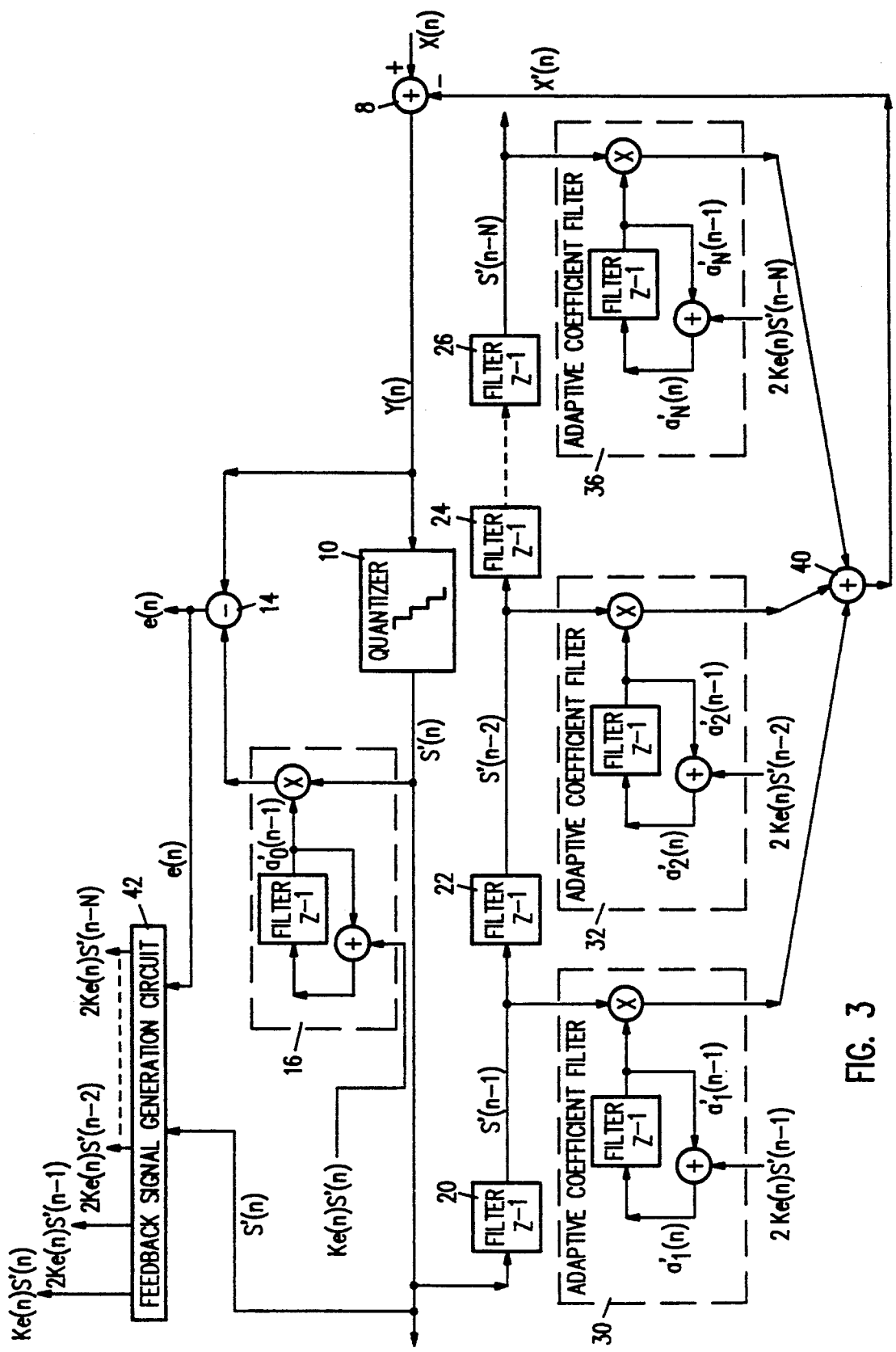
FIG. 3 is a block diagram of a preferred embodiment of the inventive decision feedback equalizer circuit.

The DFE apparatus of FIG. 3 differs from the conventional DFE apparatus of FIG. 2 by including means (e.g., circuit 42 shown in FIG. 3) which generates special feedback signals in accordance with the invention for the adaptive filter means of the apparatus, and specifically for the N adaptive coefficient filter circuits (including circuits 30, 32, 34, and 36) of the adaptive filter means. Circuit 42 receives replica signal s'(n) from quantizer 10 and error signal e(n) from the output of circuit 14, and generates the following N+1 signals therefrom: Ke(n)s'(n), 2Ke(n)s'(n−1), 2Ke(n)s'(n−2), ..., and 2Ke(n)s'(n−N). In each of these signals, the convergence scaling factor K is determined in the same conventional manner as is the convergence scaling factor K described above with reference to FIG. 2.

It is contemplated that signals $Ke(n)s'(n)$, $2Ke(n)s'(n-1)$, $2Ke(n)s'(n-2)$, ..., and $2Ke(n)s'(n-N)$ can be generated in any desired manner (rather than by a single circuit 42 as in FIG. 3).

The FIG. 3 apparatus implements a Widrow-Hoff least-mean-squared adaptation process in which feedback signals $2Ke(n)s'(n-1)$, $2Ke(n)s'(n-2)$, ..., and $2Ke(n)s'(n-N)$, are provided from circuit 42 to the adaptive filter means comprised of N identical phase delay filters (including filters 20, 22, 24, and 26), N adaptive coefficient filter circuits (including circuits 30, 32, 34, and 36), and addition circuit 40. Such adaptive filter means adaptively generates N replica coefficients $a'_j(n)$, where $j=1, 2, \ldots, N$, which define approximation $A'(z)$, and outputs replica signal $x'(n)$ during each iteration. During the "nth" iteration, the adaptive filter means updates each replica coefficient $a'_j(n)$ in response to a feedback signal $2Ke(n)s'(n-j)$, where $j=1, 2, 3, \ldots, N$. Also, during the "nth" iteration, circuit 16 receives feedback signal $Ke(n)s'(n)$ from circuit 42 and employs this feedback signal to generate the proper scaling coefficient $a'_0(n)$ for use in updating error signal $e(n)$.

Thus, in this embodiment the adaptive filter adaptively generates N replica coefficients $a'_j(n)$, where $j=1, 2, \ldots, N$, which define approximation $A'(z)$, and circuit 16 generates replica coefficient $a'_j(n)$ which it employs to generate updated error signal $e(n)$. During the "nth" iteration, the adaptive filter updates each replica coefficient $a'_j$ in response to a feedback signal $Ke(n)s'(n-j)$, for $j=0$, and updates each other replica coefficient $a'_j(n)$, for $j=1, 2, 3, \ldots, N$, in response to a feedback signal $2Ke(n)s'(n-j)$. Thus, during the "nth" iteration (prior to convergence), the FIG. 3 apparatus updates the vector $A'(n-1)$ of replica coefficients $a'_j(n-1)$ generated during the previous ("(n-1)th") iteration, according to:

$$A'(n) = A'(n-1) + KWS'(n-1)e(n-1),$$

where $A'(n)$ represents transposed vector $[a'_0(n), a'_1(n) a'_2(n) \ldots a'_N(n)]^T$, $S'(n-1)$ represents transposed vector $[s'(n) s'(n-1) s'(n-2) \ldots s'(n-N)]^T$, K is a convergence scaling factor, and W is a diagonal $(N+1) \times (N+1)$ matrix having first diagonal coefficient equal to one, all other diagonal coefficients equal to two, and all off-diagonal coefficients equal to zero.

By updating the coefficients $a'_j(n-1)$ in this manner, the invention achieves more rapid convergence than can be attained using the prior art DFE apparatus of FIG. 2.

In one example of the FIG. 3 embodiment, N is equal to 24, parameter K is equal to $2^{-11}$, and input signal $s(n)$ can take any of four different values (L=4). In this example, the DFE of the invention can reach convergence in 199.4 milliseconds.

It should be appreciated that the FIG. 3 apparatus is designed in accordance with the assumption that the receive filter (which asserts signal $x(n)$ to circuit 8) has transfer function $R(z) = 1 - (1/z)$, so that the channel response $A(z)$ to which the adaptive filter of the invention must converge is $A(z) = [1-(1/z)]H(z)$, where $H(z)$ is the transmission channel transfer function. Alternative embodiments of the invention can be designed by modifying the FIG. 3 apparatus in a manner that will be apparent to those of ordinary skill in the art in view of this specification, for processing input signals $x(n)$ output from other types of receive filters. In each embodiment of the invention, the vector $A'(n)$ of N+1 feedback signals, N of which are supplied to the adaptive filter means of the DFE feedback loop during the "nth" iteration (and the remaining one of which is employed to update error signal $e(n)$), is generated by updating the vector $A'(n-1)$ of feedback signals generated during the previous iteration, according to:

$$A'(n) = A'(n-1) + KWS'(n-1)e(n-1),$$

where $A'(n)$ represents transposed vector $[a'_1(n) a'_2(n) \ldots a'_N(n)]^T$, $S'(n-1)$ represents transposed vector $[s'(n-1) s'(n-2) \ldots s'(n-N)]^T$, K is a convergence scaling factor, and W is a diagonal $(N+1) \times (N+1)$ matrix having first diagonal coefficient equal to one, all other diagonal coefficients equal to two, and all off-diagonal coefficients equal to zero.

In accordance with the invention, a conventional DFE apparatus (e.g., the apparatus of FIG. 2) is modified by increasing, by a factor of two, each of the N feedback signals it supplies to the adaptive filter means of its DFE feedback loop (during each iteration of a blind mode decision feedback equalization process). As a result of the inventive scaling (by a factor of two) of the feedback signals supplied to the adaptive filter means of the apparatus, the convergence time of the apparatus is significantly reduced during a blind mode decision feedback equalization operation which implements a Widrow-Hoff least-mean-squared adaptation algorithm.

Various modifications and alterations in the described method and apparatus of the invention will be apparent to those skilled in the art without departing from the scope and spirit of this invention. Although the invention has been described in connection with specific preferred embodiments, it should be understood that the invention as claimed should not be unduly limited to such specific embodiments.

What is claimed is:

1. A method for performing blind mode decision feedback equalization with reduced convergence time, including the steps of:

(a) receiving a transmitted signal $x(n)$ resulting from transmission of an input signal $s(n)$ through a channel having a z-domain transfer function $A(z)$;

(b) performing a decision feedback equalization operation comprising multiple iterations on the transmitted signal $x(n)$, wherein a replica input signal $s'(n)$ is generated during each of the iterations, a feedback coefficient $a'_0(n)$ is generated in response to a feedback signal $Ke(n)s'(n)$ during each of the iterations, where K is a convergence scaling factor, and an error signal $e(n)$ is generated in response to the feedback coefficient $a'_0(n)$ during each of the iterations; and (c) during each of the iterations, processing the replica input signal $s'(n)$ in an adaptive filter means thereby generating a replica transmitted signal $x'(n)$, wherein the adaptive filter means processes the replica input signal $s'(n)$ in response to a set of adaptively generated coefficients $a'_j(n)$, where $j=1, 2, \ldots, N$, and N is an integer, and wherein each of the coefficients $a'_j(n)$ is generated in response to a feedback signal $2Ke(n)s'(n-j)$, where $j=1, 2, \ldots, N$, where K is said convergence scaling factor.

2. The method of claim 1, wherein step (c) includes the steps of:
   filtering the replica input signal s'(n) in a set of serially connected phase delay filters;
   multiplying a phase delayed output signal from each of the phase delay filters by a phase delayed version of one of the coefficients a'$_j$(n) to generate a set of N product signals; and
   summing the N product signals to generate the replica transmitted signal x'(n).

3. The method of claim 2, wherein the transmitted signal x(n) results from transmission of the input signal s(n) through a transmission channel having a z-domain transfer function H(z) and a receive filter having a z-domain transfer function $1-1/z$, and wherein the transfer function A(z) satisfies $A(z)=H(z)[1-1/z]$.

4. A decision feedback equalization apparatus for performing multiple iterations of a blind mode decision feedback equalization on a transmitted signal x(n) resulting from transmission of an input signal s(n) through a channel having a z-domain transfer function A(z), said apparatus including:
   means for generating a replica input signal s'(n) during each of the iterations;
   means for generating a feedback coefficient a'$_0$(n) in response to a feedback signal Ke(n)s'(n) during each of the iterations, where K is a convergence scaling factor;
   means for generating an error signal e(n) in response to the feedback coefficient a'$_0$(n) during each of the iterations; and
   adaptive filter means for processing the replica input signal s'(n) to generate a replica transmitted signal x'(n) in response to a set of adaptively generated coefficients a'$_j$(n), where j=1, 2, ..., N, and N is an integer, and wherein the adaptive filter means includes a means for generating each of the coefficients a'$_j$(n) in response to a feedback signal 2Ke(n)s'(n−j), where K is said convergence scaling factor.

5. The apparatus of claim 4, wherein the adaptive filter means includes:
   a set of N serially connected phase delay circuits, for receiving the replica input signal s'(n) and generating a set of N phase-delayed replica input signals in response to said replica input signal s'(n);
   a set of N coefficient updating and multiplication circuits, each connected to an output of a different one of the phase delay circuits, wherein each of the coefficient updating and multiplication circuits includes a circuit for generating a different one of the coefficients a'$_j$(n), and a multiplication circuit for multiplying one of the phase-delayed replica signals by one of the coefficients a'$_j$(n).

6. The apparatus of claim 5, wherein the adaptive filter means also includes:
   a means for combining the outputs of the coefficient updating and multiplication circuits to generate the replica transmitted signal x'(n).

7. The apparatus of claim 5, wherein the transmitted signal x(n) results from transmission of the input signal s(n) through a transmission channel having a z-domain transfer function H(z) and a receive filter having a z-domain transfer function $1-1/z$, and wherein the transfer function A(z) satisfies $A(z)=H(z)[1-1/z]$, and wherein each of the N serially connected phase delay circuits has a z-domain transfer function equal to $1/z$.

8. A decision feedback equalization apparatus for performing multiple iterations of a blind mode decision feedback equalization on a transmitted signal x(n) resulting from transmission of an input signal s(n) through a channel having a z-domain transfer function A(z), said apparatus including:
   means for generating a replica input signal s'(n) during each of the iterations;
   means for generating an error signal e(n) during each of the iterations; and
   means for generating an updated vector A'(n) of replica coefficient signals a'$_j$(n) during each of the iterations, where $A'(n)=A'(n-1)+KWS'(n-1)e(n-1)$, A'(n) is a transposed vector $[a'_0(n)\ a'_1(n)\ ...\ a'_N(n)]^T$ of said replica coefficient signals a'$_j$(n), with j=0, 1, ..., N, A'(n−1) is a transposed vector $[a'_0(n-1)\ a'_1(n-1)\ ...\ a'_N(n-1)]^T$ of coefficient signals generated during an iteration immediately preceding said each of the iterations, S'(n−1) is a transposed vector $[s'(n)\ s'(n-1)\ ...\ s'(n-N)]^T$ of said replica input signal s'(n) and phase-delayed replica input signals s'(n−m), where m=1, 2, ..., N, where e(n−1) is an error signal generated during an iteration immediately preceding said each of the iterations, K is a convergence scaling factor, and W is a diagonal (N+1)×(N+1) matrix whose first diagonal coefficient signal has a value equal to one, whose other diagonal coefficient signals each have a value equal to two, and whose off-diagonal coefficient signals each have a value equal to zero.

9. The apparatus of claim 8, wherein the means for generating the error signal e(n) includes a feedback loop for generating means for generating said error signal e(n) in response to said replica coefficient signal a'$_0$(n) during said each of the iterations.

10. The apparatus of claim 9, also including a means for generating a replica transmitted signal x'(n) during said each of the iterations by processing the phase-delayed replica input signals s'(n−m) and a subset a'$_m$(n) of the replica coefficient signals, where m=1, 2, ..., N.

* * * * *